United States Patent
Choi et al.

(10) Patent No.: US 8,465,884 B2
(45) Date of Patent: Jun. 18, 2013

(54) ELECTRON BEAM DEPICTING PATTERN DESIGN, PHOTOMASK, METHODS OF DEPICTING AND FABRICATING PHOTOMASK, AND METHOD OF FABRICATING SEMICONDUCTOR DEVICE USING THE SAME

(75) Inventors: Jin Choi, Seoul (KR); Sang-Hee Lee, Yongin-si (KR); Rae-Won Yi, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 12/974,550

(22) Filed: Dec. 21, 2010

(65) Prior Publication Data

US 2011/0165778 A1 Jul. 7, 2011

(30) Foreign Application Priority Data

Jan. 5, 2010 (KR) .......................... 10-2010-0000602

(51) Int. Cl.
*G03F 1/20* (2012.01)

(52) U.S. Cl.
USPC .................. 430/5; 430/30; 430/296; 430/942

(58) Field of Classification Search
USPC ........................................ 430/5, 30, 296, 942
See application file for complete search history.

(56) References Cited

U.S. PATENT DOCUMENTS

| 6,034,376 A | 3/2000 | Ema |
| 6,251,541 B1 | 6/2001 | Yamada |

FOREIGN PATENT DOCUMENTS

| JP | 2002-260982 A | 9/2002 |
| KR | 10 1998-0014867 A | 11/1998 |
| KR | 10 1998-0008413 A | 9/2000 |
| KR | 10 2003-0058582 A | 7/2003 |

*Primary Examiner* — Christopher Young
(74) *Attorney, Agent, or Firm* — Lee & Morse, P.C.

(57) ABSTRACT

A method of depicting a photomask using e-beams includes preparing a photomask having an e-beam resist, depicting the e-beam resist and forming an e-beam resist pattern on the photomask. Depicting the e-beam resist includes irradiating e-beams to an e-beam depiction region without irradiating the e-beams to an e-beam non-depiction region disposed in the e-beam depiction region. The e-beam depiction region and the e-beam non-depiction region are formed using an e-beam resist pattern having the same polarity.

14 Claims, 15 Drawing Sheets

ELECTRON BEAM DEPICTING PATTERN DESIGN, PHOTOMASK, METHODS OF DEPICTING AND FABRICATING PHOTOMASK, AND METHOD OF FABRICATING SEMICONDUCTOR DEVICE USING THE SAME

BACKGROUND

1. Field

Example embodiments relate to an electron beam depicting pattern design, a photomask, methods of depicting and fabricating a photomask, and a method of fabricating a semiconductor device using the same.

2. Description of the Related Art

With an increase in the density of patterns formed on a photomask, proximity effects between patterns formed in a high-density region has worsened.

SUMMARY

Embodiments are therefore directed to an electrode beam depicting pattern design, a photomask, method of depicting and fabricating photomasks, and method of fabricating a semiconductor device using the same, which substantially overcome one or more of the problems due to the limitations and disadvantages of the related art.

It is therefore a feature of an embodiment to provide an electron beam (e-beam) depicting pattern design.

It is therefore another feature of an embodiment to provide a photomask.

It is therefore another feature of an embodiment to provide a method of depicting a photomask using e-beams.

It is therefore another feature of an embodiment to provide a method of fabricating a photomask.

The technical features of the inventive disclosure are not limited to the above disclosure; other features may become apparent to those of ordinary skill in the art based on the following descriptions.

According to example embodiments, an e-beam depicting pattern design includes an e-beam depiction region where e-beam resist disposed on a photomask is irradiated with e-beams to form an e-beam resist pattern and an e-beam non-depiction region disposed in the e-beam depiction region and in which the e-beam resist is not irradiated with the e-beams to form a portion of the e-beam resist pattern.

According to other example embodiments, a photomask includes an e-beam depiction region where e-beam resist disposed on the photomask is irradiated with e-beams to form an e-beam resist pattern and e-beam non-depiction regions disposed in the e-beam depiction region and in which the e-beam resist is not irradiated with the e-beams. In the e-beam depiction region and the e-beam non-depiction regions, the e-beam resist is removed to form the e-beam resist pattern exposing a component formed under the e-beam resist.

According to still other example embodiments, a photomask includes optical patterns disposed on a photomask substrate. The optical patterns include transparent regions where the photomask substrate is exposed and opaque regions where an opaque pattern is formed on the photomask substrate. At least one of the transparent regions includes an e-beam depiction region and an e-beam non-depiction region.

According to yet other example embodiments, a method of depicting a photomask using e-beams includes preparing a photomask on which e-beam resist is formed, depicting the e-beam resist, and forming an e-beam resist pattern. Depicting the e-beam resist may include irradiating e-beams to an e-beam depiction region without irradiating the e-beams to an e-beam non-depiction region disposed in the e-beam depiction region. The e-beam depiction region and the e-beam non-depiction region are formed using an e-beam resist pattern having the same polarity.

According to yet other example embodiments, a method of fabricating a photomask includes preparing a photomask substrate forming an opaque layer on the photomask substrate; forming e-beam resist on the opaque layer depicting the e-beam resist using e-beams; and forming an e-beam resist pattern. Depicting the e-beam resist using the e-beams includes depicting an e-beam depiction region using the e-beams without depicting an e-beam non-depiction region using the e-beams. The e-beam non-depiction region is disposed in the e-beam depiction region. The e-beam resist depicted using the e-beams may include an open region exposing the opaque layer and a non-open region covering the opaque layer. The open region includes the e-beam depiction region and the e-beam non-depiction region.

According to yet other example embodiments, a method of fabricating a semiconductor device using a method of depicting a photomask using e-beams includes preparing the photomask, forming a material layer on a wafer, forming photoresist on the material layer, irradiating the photoresist with light using the photomask, developing the irradiated photoresist to form a photoresist pattern, etching the material layer using the photoresist pattern as an etch mask to form a material layer pattern, and removing the photoresist pattern. The photomask includes a depiction region in which e-beams are irradiated, and a non-depiction region disposed in the depiction region and in which the e-beams are not irradiated.

Particulars of other embodiments are included in the detailed description and drawings.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
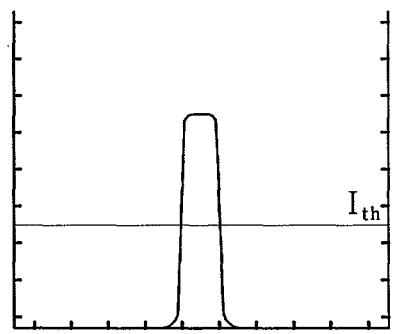
FIGS. 1A and 1B illustrate graphs of e-beam profiles showing the intensities of e-beams required for depicting an isolated pattern and an alternating pattern.

Korean Patent Application No. 10-2010-0000602, filed on Jan. 5, 2010, in the Korean Intellectual Property Office, and entitled: "Electron Beam Depicting Pattern Design, Photomask, Methods of Depicting and Fabricating Photomask, and Method of Fabricating Semiconductor Device Using the Same," is incorporated by reference herein in its entirety.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. Like numbers refer to like elements throughout.

Embodiments of the present inventive concept are described herein with reference to plan and cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the present inventive concept.

In the present specification, the term "pattern" may refer to a geometrically planar shape already formed or to be formed on a photomask. Alternatively, the term "pattern" may refer to the shape of e-beam resist already formed or to be formed on a photomask. Ideally, since e-beam resist has the same shape as an etching target material, the e-beam resist and the etching target material may be synonymous with each other. After forming an e-beam resist pattern using a development process, an optical opaque layer may be patterned using the e-beam resist pattern as an etch mask. Ideally, since the e-beam resist pattern has the same shape as an optical opaque pattern, the shapes of the e-beam resist pattern and the optical opaque pattern may not be differently described.

In the present specification, the term "depiction" refers to irradiating e-beam resist formed on a photomask with e-beams. An e-beam depiction system may be constructed to irradiate or shoot spot-shaped e-beams toward a target using an e-beam gun capable of irradiating e-beams. Thus, the term "depiction" may be interpreted as writing or drawing a pattern shape to facilitate understanding of the inventive concept. In the present specification, the terms "depiction" and "irradiation" may have the same meaning as commonly understood by one of ordinary skill in the art to which this invention belongs terms except that the term "depiction" may be interpreted as having a spatial meaning and the term "irradiation" may be interpreted as an operational meaning.

Figure 1B:
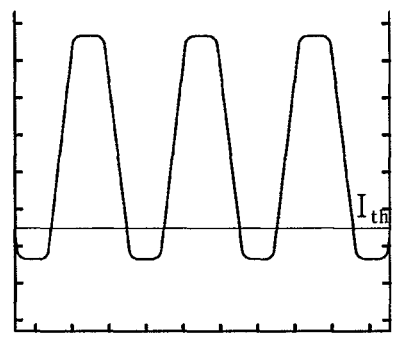
Figure 2A:
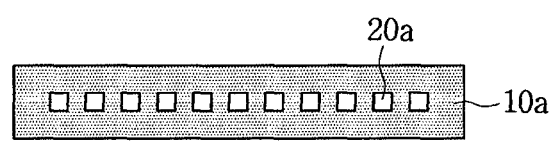
FIGS. 2A through 2D illustrate schematic diagrams of pattern designs according to example embodiments.
Figure 2B:
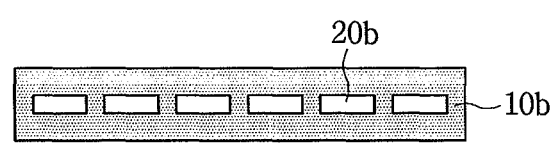
Figure 2C:
Figure 2D:

FIGS. 1A and 1B are graphs of e-beam profiles showing the intensities of e-beams required for depicting an isolated pattern and an alternating pattern. The alternating pattern may be referred to as a line-and-space pattern. In each of FIGS. 1A and 1B, an abscissa denotes the width of a depiction region irradiated with e-beams, and an ordinate denotes the intensity of irradiated e-beams. The intensity of e-beams may be interpreted as a dose dimension or an energy dimension. The dose of e-beams may refer to the number of electrons irradiated per unit area. Therefore, in the present specification, the intensity of e-beams, the dose of e-beams, and the energy of e-beams may be synonymous with one another. Referring to FIG. 1A, a curve of the e-beam profile of the isolated pattern may have a relatively abrupt slope. In other words, the slope of the curve of the e-beam profile may be almost vertical. Referring to 1B, a curve of the e-beam profile of the alternating pattern may have a relatively un-abrupt slope. In other words, the slope of the curve of the e-beam profile of the alternating pattern may be less vertical than that of the curve of the e-beam profile of the isolated pattern. The term "threshold intensity" refers to the minimum irradiation intensity of e-beams required for developing e-beam resist to form an e-beam resist pattern. Specifically, when e-beams having the threshold intensity or higher are irradiated, the e-beam resist may be patterned to form the e-beam resist pattern; while when e-beams having a lower intensity than the threshold intensity are irradiated, the e-beam resist may not be patterned but remained as it is. The threshold intensity may not be an absolute value but vertically varied according to various process parameters. The slope of the curve of the e-beam profile refers to the sensitivity of the width of patterns to the vertical variation in the threshold intensity.

For example, assuming that the curve of the e-beam profile has a relatively abrupt slope as shown in FIG. 1A, when the threshold intensity vertically varies, the width of the patterns may have a relatively small variation. Assuming that the curve of the e-beam profile has a relatively un-abrupt slope as shown in FIG. 1B, when the threshold intensity vertically varies, the width of the patterns may have a relatively great variation. The smaller the variation of the width of the patterns becomes, the more stable and satisfactory the entire process may become. More specifically, a variation in the intensity of the e-beams or a variation in the threshold intensity may be a process parameter in a semiconductor fabrication process. The e-beam profiles may not always have constant intensities but be varied due to various internal or external factors. From the industrial point of view, even if process factors of fabrication processes are varied, products may always be made to meet standards. Therefore, the curves of the e-beam profiles may have smaller widths and more vertical slopes if possible. Since the intensity of e-beams varies along a Y-axial direction, when the curve of the e-beam profile has a vertical slope, patterns may not be affected by the variation in the threshold intensity at all. Thus, process conditions may be determined such that the slope of the curve of the e-beam profile is almost vertical, that is, infinite ($\infty$).

It may be more difficult to make a relatively abrupt curve of the e-beam profile in the alternating pattern. Since e-beams have repulsion forces of electrons and e-beam lithography technology physically inject electrons into a target material, the injected electrons may collide with atoms in the target material to cause various scattering phenomena. For this reason, e-beams may inherently cause negative phenomena, called a proximity effect. For reference, an electron beam (e-beam) proximity effect must not be confused with an optical proximity effect, as they are entirely different. The optical proximity effect may occur due to inherent characteristics of light, for example, diffraction, interference, or scattering of light, while the electron-beam proximity effect may occur due to inherent characteristics of electrons, for example, repulsion of e-beams against electrons and scattering caused by physical collision of electrons with atoms. When patterns are proximately formed, that is, when e-beams are irradiated to two proximate regions, the e-beam proximity effect may bring about an unnecessary increase in the intensity of e-beams in a space between the two proximate regions. Worse yet, the intensity of e-beams may become higher than a threshold intensity so that a region that is not intended to be patterned may be patterned. Although lowest values of e-beam profiles should ideally be zero (0) in a right portion of FIG. 1B, it can be seen that the lowest values of the e-beam profiles are not actually zero. Although differences between the lowest values of the e-beam profiles and the threshold intensity should be as great as possible, it can be seen that the differences are not actually great. As can be seen from FIGS. 1A and 1B, the alternating pattern is very susceptible to the e-beam proximity effect.

FIGS. 2A through 2D are schematic diagrams of pattern designs according to example embodiments. The designs may be interpreted as e-beam depicting pattern designs disposed on computer data, which may be confirmed via, e.g., a computer monitor. Alternatively, the designs may be interpreted as shapes obtained by ideally depicting e-beam resist disposed on a photomask with e-beams. Referring to FIGS. 2A through 2D, each of the pattern designs according to the example embodiments may include e-beam depiction regions 10a to 10d and e-beam non-depiction regions 20a to 20d disposed in the e-beam depiction regions 10a-10d. More specifically, the e-beam non-depiction regions 20a to 20d may have a rectangular shape, a horizontal bar shape, a vertical bar shape, a horizontal line shape, or various combinations thereof. Since the shapes of the e-beam non-depiction regions 20a to 20d are seen from the plan views, horizontal and vertical directions would be insignificant. However, it may be inferred that e-beam non-depiction regions according to the inventive concept may have various shapes.

The inventive concept may be understood with reference to FIGS. 2A through 2D. The length of a short side of each of the e-beam non-depiction regions 20a to 20d may be set as about twice a diffusion distance of acid radicals (H+) of chemically-amplifying-type e-beam resist. Since the diffusion distance of acid radicals of the chemically-amplifying-type e-beam resist varies with the characteristics of the corresponding e-beam-resist, it is difficult to present precise numerical values of the diffusion distance. However, the diffusion distances of acid radicals of the chemically amplifying type e-beam resist may not vary greatly, and e-beam resists of which the diffusion distance of acid radicals is, e.g., about 30 nm. When the diffusion distance of acid radicals is excessively great, the shape of actually formed patterns may greatly differ from a designed shape. When the diffusion distance of acid radicals is excessively small, e-beam resist may be patterned with low efficiency. Although low patterning efficiency is not necessarily undesirable, e-beam resist having an appropriate diffusion distance may be used for various reasons. For example, a diffusion distance of acid radicals may be appropriately determined according to process characteristics in order to optimize a process of developing depicted e-beam resist. A diffusion distance of acid radicals of e-beam resist used in an experiment according to the exemplary embodiments was about 30 nm, and a short side of each of the e-beam non-depiction regions 20a to 20d may be set as about 50 to 70 nm. Since a design margin of about ±20% may be allowed from the range of an ideal diffusion distance of acid radicals, a slight vertical margin may be provided. The design margin of about ±20% may be optimized using various additional processes for fabricating a photomask.

For example, the additional processes may include a pre-bake process, an additional depiction process of additionally depicting all of an e-beam depiction region and e-beam non-depiction regions, a post-bake process, a development process, a de-scum process, and an etching process. The pre-bake process may be a process of heating e-beam resist at a temperature below a glass transition temperature before an e-beam depiction process. The pre-bake process may be performed to remove a solvent and unnecessary gases remaining in the e-beam resist. The post-bake process may allow acid radicals generated during the e-beam depiction process to diffuse and move into a base resin of the e-beam resist and decompose protecting groups. Heating temperature and time may act as process parameters in the pre- and post-bake processes. Since the pre-bake and post-bake processes affect the depiction of e-beam resist and the generation and diffusion of acid radicals, the process margin may be optimized. The additional depiction process of additionally depicting all of the e-beam depiction region and the e-beam non-depiction regions may be performed to wholly irradiate e-beams at a lower dose than an appropriate dose in order to reduce an e-beam proximity effect. A region that is depicted with e-beams at a low dose may not be patterned when the region is not irradiated with e-beams at a threshold intensity or higher. There may be a close correlation between the threshold intensity and dose of e-beams. The threshold intensity and dose of the e-beams may be freely determined for various reasons. During the development process, the removed amount of e-beam resist in the depiction region may be controlled by adjusting the characteristics, concentration, and reaction time of a developing solution. The de-scum process may be performed to completely remove residue of e-beam resist, which is intended to be removed after the development process, using $O_2$ plasma. Even during the de-scum process; the patterning of the e-beam resist may be optimized. The etching process may be performed to selectively remove an opaque material layer using an e-beam resist pattern as an etch mask. In this case, the opaque material layer may be further removed using an overetching process. During the etching process, a process margin may be optimized not during the patterning of the e-beam resist but during the patterning of the opaque material layer. A unit beam shot region of an e-beam depiction system may be formed as a rectangular type. As shown in FIGS. 2A through 2D, when the e-beam non-depiction regions 20a to 20d are not formed in the e-beam depiction regions 10a to 10d, one to several unit beam shot regions capable of irradiating all or large areas of the e-beam depiction regions 10a to 10d may be depicted.

According to an exemplary embodiment, the unit depiction region may be divided into a plurality of divided sub-depiction regions and a non-depiction region, and each of the divided sub-depiction regions may be depicted as a plurality of divided sub-unit beam shot regions. That is, it may be comprehended that the unit beam shot region may be divided into at least two sub-unit beam shot regions, and the unit depiction region may be depicted as sub-unit depiction regions. It can be inferred that the sub-unit beam shot region has a smaller size than the unit beam shot region. Also, it may be inferred that the sub-unit beam shot region is irradiated with e-beams at a lower intensity than the unit beam shot region.

Referring to FIGS. 1A and 1B, it may be inferred that the e-beam proximity effect may be reduced by reducing the intensity of e-beams. Specifically, when the intensity of e-beams is reduced, that is, when the maximum intensity of e-beams is reduced, even the minimum intensities of e-beams may be reduced due to the e-beam proximity effect. In other words, a difference between an intensity at which the e-beam proximity effect occurs and a threshold intensity may be increased. This means a high pattern fidelity. Accordingly, the exemplary embodiment may produce substantially the same effect as when the e-beam depiction region is irradiated with a smaller number of electrons than in the conventional case, that is, at a lower dose of e-beams. Therefore, according to the exemplary embodiment, substantially the same effect as when the e-beam depiction region is irradiated with e-beams at a lower intensity may be obtained.

The inventive concept may be applied, e.g., when the e-beam depiction regions 10a to 10d are disposed adjacent to one another. In particular, the inventive concept may be usefully applied to the alternating pattern in order to reduce an e-beam proximity effect. Since lines and spaces may alternate in length and width directions in the alternating pattern, the alternating pattern may be differently interpreted as a high-density pattern. According to an exemplary embodiment, the isolated pattern may be separated from the alternating pattern based on a pattern density of about 50%. Specifically, the isolated pattern may refer to a region in which a unit area has a pattern density of lower than about 50%, and the alternating pattern may refer to a region in which a unit area has a pattern density of about 50% or higher. Alternatively, the e-beam depiction regions 10a to 10d in the isolated pattern may be free from other e-beam depiction regions within the range of a distance of at most twice the widths thereof in the direction of short lengths of the e-beam non-depiction regions 20a to 20d. Also, since it may be unnecessary to apply the inventive concept to the isolated pattern, it may be comprehended that the e-beam depiction region does not include the e-beam non-depiction region in the isolated pattern. Therefore, it may be comprehended that other e-beam depiction regions are disposed within the range of a distance of at most twice the width of the e-beam depiction region in the alternating pattern. In the alternating pattern, the e-beam depiction region may include the e-beam non-depiction region.

Figure 3A:
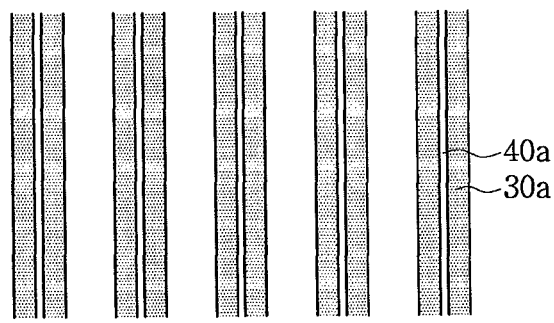
FIGS. 3A through 3G illustrate schematic diagrams of actual pattern designs having various shapes according to example embodiments.
Figure 3B:
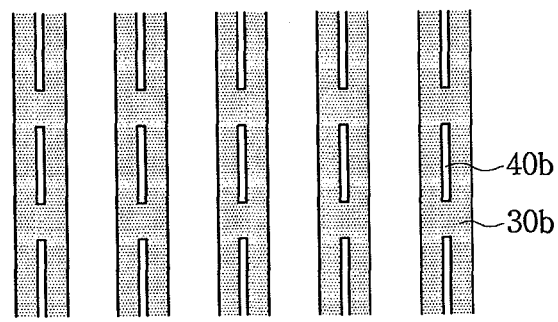
Figure 3C:
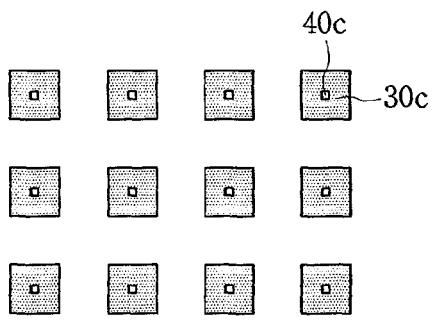
Figure 3D:
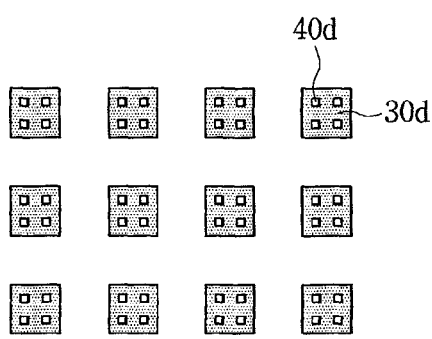
Figure 3E:
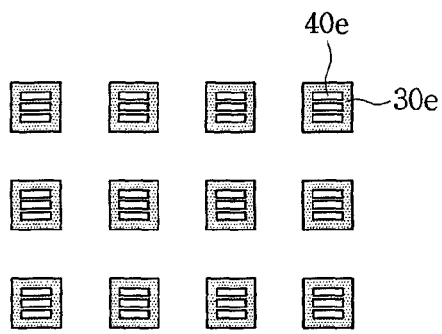
Figure 3F:
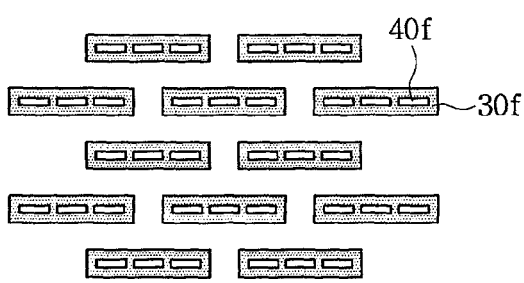
Figure 3G:
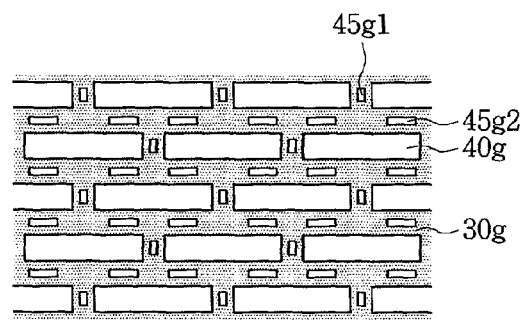

FIGS. 3A through 3G are diagrams of actual pattern designs having various shapes, which are obtained by applying example embodiments to known pattern layouts. Referring to FIG. 3A, a pattern design according to example embodiments may include line-shaped e-beam non-depiction regions 40a disposed in line-shaped e-beam depiction regions 30a. Referring to FIG. 3B, a pattern design according to example embodiments may include bar-shaped e-beam non-depiction regions 40b disposed in line-shaped e-beam depiction regions 30b. The line-shaped e-beam depiction regions 30a and 30b may be interpreted as gate line patterns or bit line patterns. Referring to FIG. 3C, a pattern design according to example embodiments may include small-island-shaped e-beam non-depiction regions 40c disposed in island-shaped e-beam depiction regions 30c. Referring to FIG. 3D, a pattern design according to example embodiments may include a plurality of small-island-shaped e-beam non-depiction regions 40d disposed in island-shaped e-beam depiction regions 30d. Referring to FIG. 3E, a pattern design according to example embodiments may include a plurality of bar-shaped e-beam non-depiction regions 40e disposed in island-shaped e-beam depiction regions 30e. The island-shaped e-beam depiction regions 30c to 30e may be interpreted as contact patterns. The shapes and arrangements of the e-beam non-depiction regions 40c to 40e may be variously applied. Referring to FIG. 3F, a pattern design according to example embodiments may include island- or bar-shaped e-beam non-depiction regions 40f disposed in bar-shaped e-beam depiction regions 30f. The bar-shaped e-beam depiction regions 30f may be interpreted as active regions. At least one e-beam non-depiction region 40f may be disposed. Referring to FIG. 3G, a pattern design according to example embodiments may include island- or bar-shaped non-depiction regions 45g1 or 45g2 disposed between e-beam non-depiction patterns 40g in an e-beam depiction region having the e-beam non-depiction patterns 40g. The bar-shaped e-beam non-depiction patterns 40g may be interpreted as active patterns.

Figure 4A:
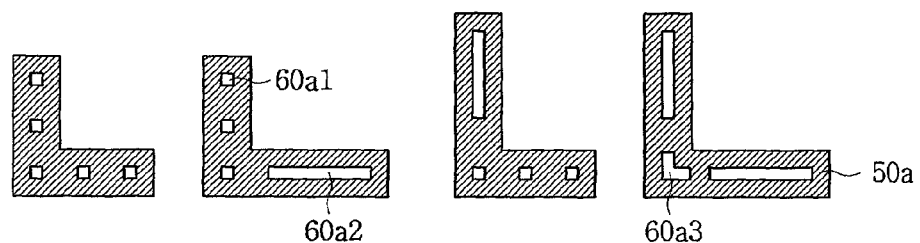
FIGS. 4A through 4D illustrate diagrams of various shapes of pattern designs according to example embodiments.
Figure 4B:
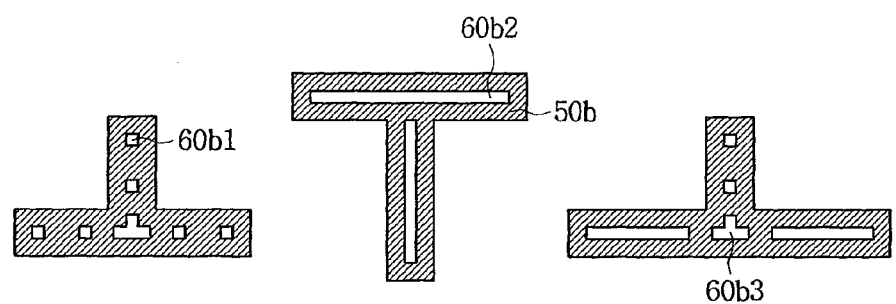
Figure 4C:
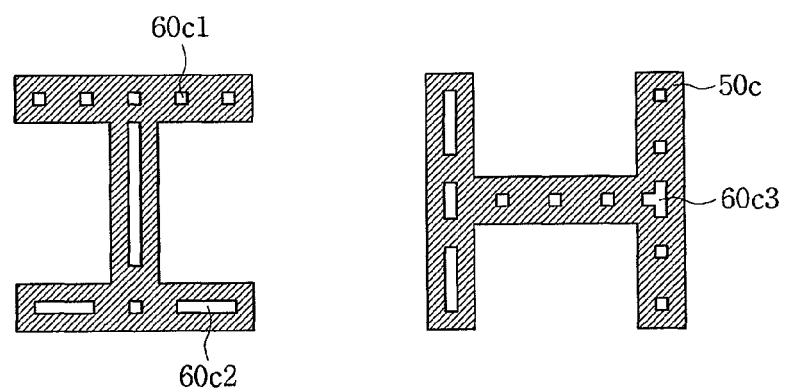
Figure 4D:
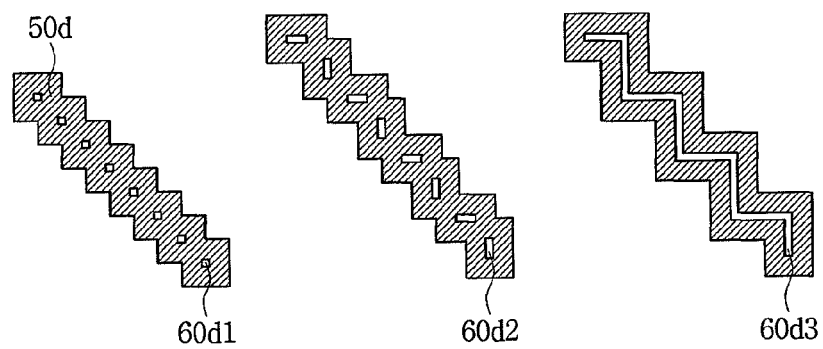

FIGS. 4A through 4D are diagrams of various shapes of pattern designs according to example embodiments. Referring to FIG. 4A, a pattern design according to example embodiments may include e-beam non-depiction regions 60a1, 60a2, and 60a3 having various shapes disposed in L-shaped e-beam depiction regions 50a. Referring to FIG. 4B, a pattern design according to example embodiments may include e-beam non-depiction regions 60b1, 60b2, and 60b3 having various shapes disposed in T-shaped e-beam depiction regions 50b. Referring to FIG. 4C, a pattern design according to example embodiments may include e-beam non-depiction regions 60c1, 60c2, and 60c3 having various shapes disposed in H-shaped e-beam depiction regions 50c. Referring to FIG. 4D, a pattern design according to example embodiments may include e-beam non-depiction regions 60d1, 60d2, and 60d3 having various shapes disposed in diagonal e-beam depiction regions 50d. Even if the present drawings are not specifically described, it may be fully understood by those skilled in the art that the inventive concept may be applied in other various shapes than those shown in the present specification. Particularly, although FIG. 4D illustrates that the diagonal e-beam depiction regions 50d have stepwise lateral lines, the stepwise lateral lines are enlarged. Diagonal depiction patterns are not actually formed using an e-beam depiction technique because e-beams do not have diagonal shapes. Diagonal lines may be embodied by irradiating e-beams in small rectangular shapes. FIG. 4D illustrates the above-described concept.

Figure 5A:
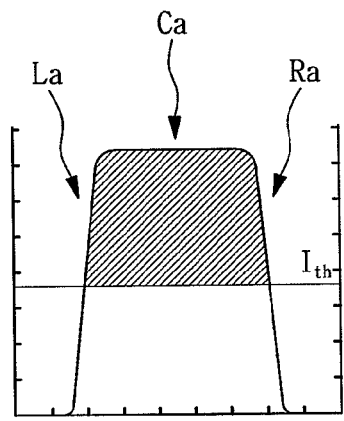
FIGS. 5A through 5C illustrate graphs showing imaginary e-beam profiles of depiction regions according to example embodiments.
Figure 5B:
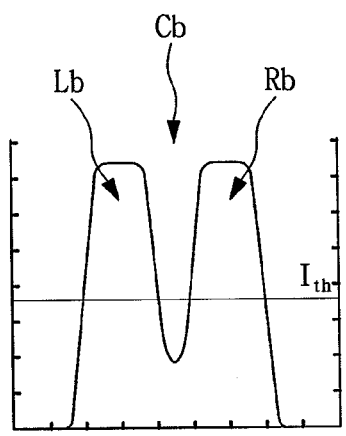
Figure 5C:
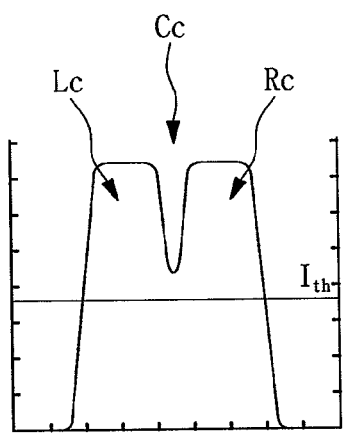
Figure 6A:
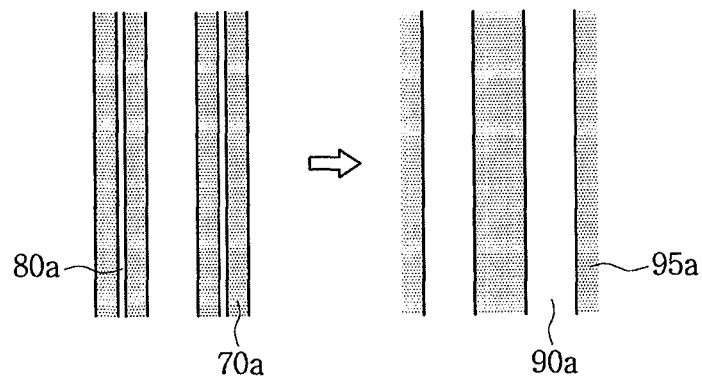
FIGS. 6A through 6G illustrate diagrams of ideal pattern shapes of e-beam resists formed by performing an e-beam depicting process on pattern designs according to example embodiments.
Figure 6B:
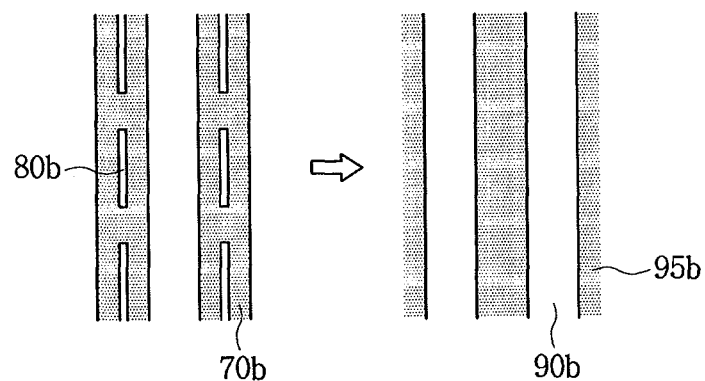
Figure 6C:
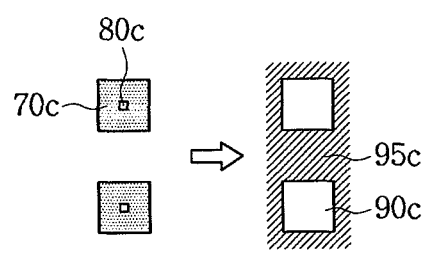
Figure 6D:
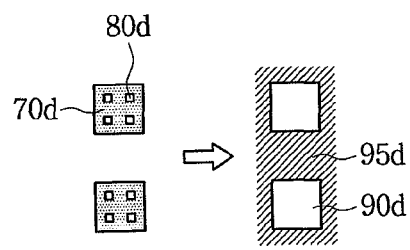
Figure 6E:
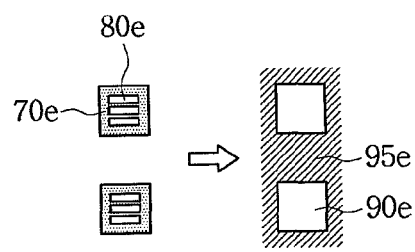
Figure 6F:
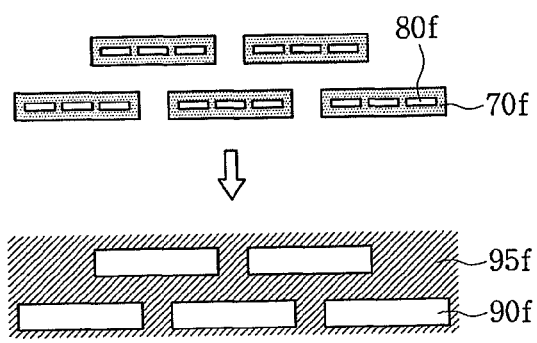
Figure 6G:
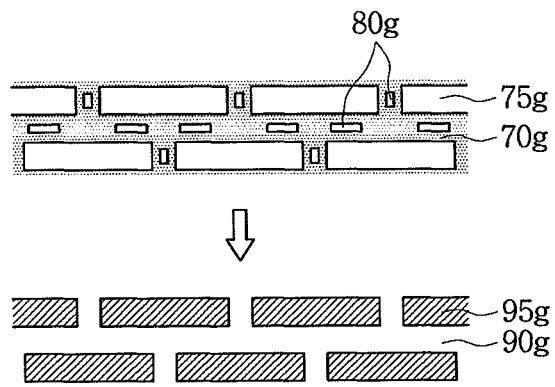

FIGS. 5A through 5C are graphs showing imaginary e-beam profiles of depiction regions according to example embodiments. In FIGS. 5A through 5C, an abscissa denotes a width or distance, and an ordinate denotes the intensity of e-beams. Also, a horizontal dotted line denotes a threshold intensity Ith of e-beams. A region of e-beam resist, which is irradiated with e-beams having the threshold intensity Ith or higher may be patterned, while a region of the e-beam resist, which is irradiated with e-beams having an intensity lower than the threshold intensity Ith, may not be patterned.

FIG. 5A shows the profile of e-beams in a case where an e-beam non-depiction region is not formed in an e-beam depiction region. In a profile region having an e-beam intensity higher than the threshold intensity Ith, since e-beam profiles of left and right boundary lines La and Ra and their vicinities greatly contribute to defining a pattern, the e-beam profiles should have a much higher intensity than the threshold intensity Ith. Conversely, since the e-beam profile of a central region Ca does not greatly contribute to defining the pattern, the e-beam profile of the central region Ca may not have a much higher intensity than the threshold intensity Ith. In other words, the e-beam intensity of the central region Ca may be a surplus intensity. In FIGS. 5B and 5C, a central region Cb may be an e-beam non-depiction region, and e-beam depiction regions Lb and Rb may be formed on both sides of the central region Cb. FIG. 5B shows a case where the e-beam non-depiction regions Cb have a lower e-beam intensity than the threshold intensity Ith, and FIG. 5C shows a case where an e-beam non-depiction region Cc has a higher e-beam intensity than the threshold voltage Ith. Referring to the e-beam profile of FIG. 5B, the central e-beam non-depiction region Cb may be formed as a pattern in which e-beams are not irradiated. According to the present example embodiment, even if e-beams are not irradiated, the same effect as when e-beams are irradiated may be produced. That is, an e-beam profile according to an exemplary embodiment, may be interpreted as the e-beam profile shown in FIG. 5C.

Referring to FIG. 5C, although e-beams are not irradiated to a portion of the e-beam non-depiction regions Cc, the portion may have an e-beam profile having a threshold intensity Ith or higher. That is, the e-beam non-depiction region Cc may not be patterned (e.g., non-depicted pattern). In other words, the e-beam non-depiction region Cc may be patterned to have the same polarity as the e-beam depiction region. The polarity may refer to remain, or non-remain of e-beam resist. According to the present embodiment, a region where e-beam resist is removed to expose a component disposed under the e-beam resist may be expressed as a clear pattern, while a region where the e-beam resist is not removed may be expressed as a dark pattern. In this case, when the underlying opaque layer selectively exposed by the e-beam resist pattern is removed, a transparent photomask substrate may be exposed. In this case, an exposed region of the transparent photomask substrate may be expressed as a clear pattern; while a region where the opaque layer remains not to expose the transparent photomask substrate may be expressed as a dark pattern.

FIGS. 6A through 6G are diagrams of ideal pattern shapes of e-beam resists formed by performing an e-beam depicting process on pattern designs according to example embodiments. Referring to FIG. 6A through 6G, in the pattern designs according to the example embodiments, non-depiction regions 80a to 80g disposed in depiction regions 70a to 70g may not be present in final patterns of e-beam resist. That is, only depiction patterns 90a to 90g and non-depiction patterns 95a to 95g may be remained. In order to facilitate understanding of the inventive concept, it is assumed that positive-type e-beam resist is used. That is, since e-beam resist is removed from an e-beam irradiation region during a development process, an underlying opaque layer may be exposed, and e-beam resist may remain in an e-beam non-irradiation region. In the drawings, un-hatched regions 90a to 90g may correspond to the depiction regions 70a to 70g. When the positive-type e-beam resist is used, the pattern design may have a reverse shape to an e-beam resist pattern. Alternatively, it may be inferred that the underlying opaque layer may be patterned using an e-beam resist pattern as an etch mask to form an opaque pattern on a photomask. That is, the un-hatched regions 90a to 90g may be interpreted as opaque material regions. The term "opaque material" may be used in the case of a binary photomask and correspond to a half-tone layer in the case of an attenuated phase-shift photomask. Alternatively, the term "opaque material" may be interpreted as an etched or unetched photomask substrate in the case of a chromium (Cr)-less phase-shift photomask, that is, a substrate-etching phase-shift photomask. In conclusion, in the case of a phase-shift photomask, a hatched region and unhatched regions may be interpreted as a phase-shift region and phase-non-shift regions, respectively, or vice versa.

Figure 7A:
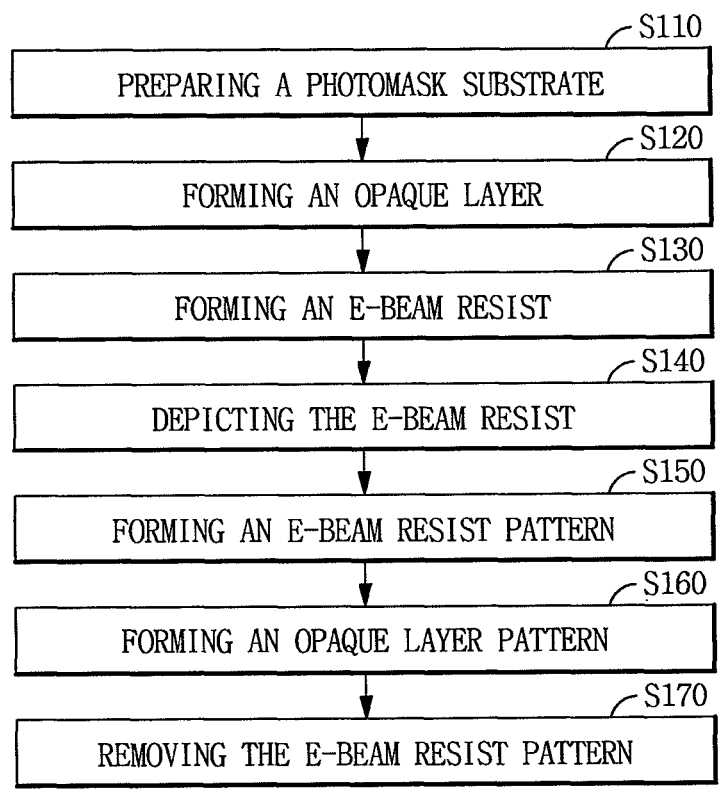
FIGS. 7A through 7C illustrate flowcharts illustrating methods of fabricating photomasks according to example embodiments.
Figure 7B:
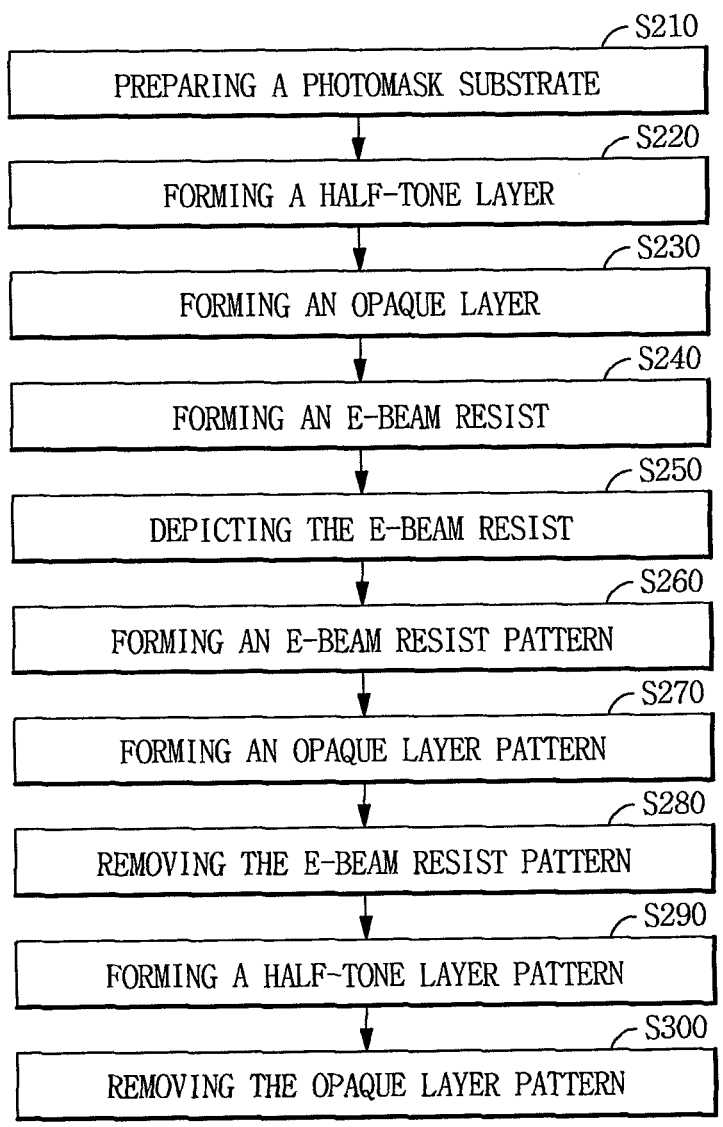
Figure 7C:
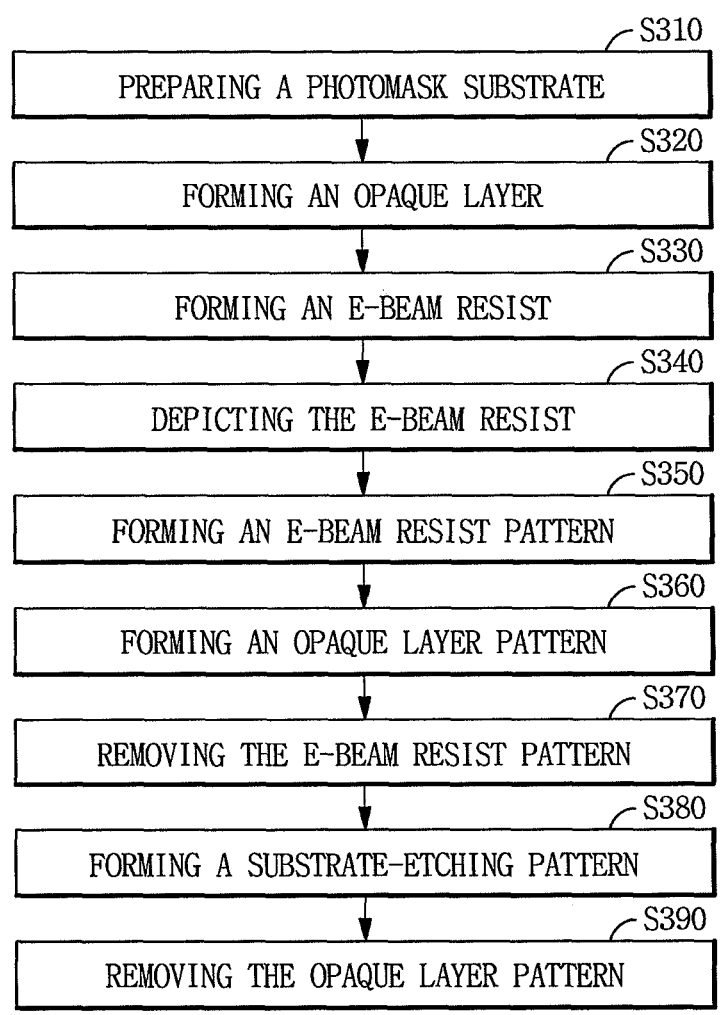

FIGS. 7A through 7C are flowcharts illustrating methods of fabricating photomasks according to example embodiments. Referring to FIG. 7A, a method of fabricating a photomask according to example embodiments may include preparing a photomask substrate (S110), forming an opaque layer on the photomask substrate (S120), forming e-beam resist on the opaque layer (S130), depicting the e-beam resist (S140), developing the depicted e-beam resist to form an e-beam resist pattern (S150), etching the opaque layer using the e-beam resist pattern as an etch mask to form an opaque layer pattern (S160), and removing the e-beam resist pattern (S170). After forming the e-beam resist on the opaque layer and before irradiating e-beams, the method may further include pre-baking the e-beam resist. After irradiating the e-beams to the e-beam resist and before developing the e-beam resist, the method may further include post-baking the e-beam resist. After developing the e-beam resist, the method may further include removing residual of the e-beam resist using a descum process. After removing the e-beam resist pattern, the method may further include cleaning an opaque layer pattern. The irradiation of the e-beams may include loading pattern design data to be irradiated to the photomask in an e-beam irradiation system, loading the photomask in the e-beam irradiation system, and irradiating e-beams onto the photomask based on the pattern design data. A pattern design may include a depiction region and non-depiction regions that are disposed in the depiction region and not formed as e-beam resist patterns. The non-depiction regions may be formed as a rectangular or bar type. The length of a short side of each of the non-depiction regions may be at most about 2.4 times, e.g., 0 to about 2.4 times, the diffusion distance of acid radicals of the e-beam resist.

Referring to FIG. 7B, a method of fabricating an attenuated phase-shift photomask according to example embodiments may include preparing a photomask substrate (S210), forming a half-tone layer on the photomask substrate (S220), forming an opaque layer on the half-tone layer (S230), forming e-beam resist on the opaque layer (S240), depicting the e-beam resist (S250), developing the depicted e-beam resist to form an e-beam resist pattern (S260), etching the opaque layer using the e-beam resist pattern as an etch mask to form an opaque layer pattern (S270), removing the e-beam resist pattern (S280), etching the half-tone layer using the opaque layer pattern as an etch mask to form a half-tone layer pattern (S290), and removing the opaque layer pattern (S300). The opaque layer pattern may be selectively patterned. After forming the e-beam resist on the opaque layer and before irradiating the e-beams, the method may further include pre-baking the e-beam resist. After irradiating the e-beam resist with the e-beams and before developing the e-beam resist, the method may further include post-baking the e-beam resist. After developing the e-beam resist, the method may further include removing residue of the e-beam resist using a descum process. After removing the e-beam resist pattern, the method may further include cleaning the opaque layer pattern. After removing the opaque layer pattern, the method may further include cleaning the half-tone layer pattern. The irradiation of the e-beams may include loading pattern design data to be irradiated to the photomask in an e-beam irradiation system, loading the photomask in the e-beam irradiation system, and irradiating the e-beams onto the photomask based on the pattern design data. A pattern design may include a depiction region and non-depiction regions that are disposed in the depiction region are not formed as e-beam resist patterns. The non-depiction regions may be formed as a rectangular or bar type. The length of a short side of each of the non-depiction regions may be at most 2.4 times the diffusion distance of acid radicals of the e-beam resist.

Referring to FIG. 7C, a method of fabricating a substrate-etching phase-shift photomask according to example embodiments may include preparing a photomask substrate (S310), forming an opaque layer on the photomask substrate (S320), forming e-beam resist on the opaque layer (S330), depicting the e-beam resist (S340), developing the depicted e-beam resist to form an e-beam resist pattern (S350), etching the opaque layer using the e-beam resist pattern as an etch mask to form an opaque layer pattern (S360), removing the e-beam resist pattern (S370), etching the photomask substrate using the opaque layer pattern as an etch mask to form a substrate-etching pattern (S380), and removing the opaque layer pattern (S390). The substrate-etching pattern may be a pattern obtained by selectively recessed the photomask substrate. The opaque layer pattern may be selectively removed. After forming the e-beam resist on the opaque layer and before irradiating the e-beam, the method may further include pre-baking the e-beam resist. After irradiating the e-beams to the e-beam resist and before developing the e-beam resist, the method may further include post-baking the e-beam resist. After developing the e-beam resist, the method may further include removing residue of the e-beam resist using a descum process. After removing the e-beam resist pattern, the method may further include cleaning the opaque layer pattern.

After removing the opaque layer pattern, the method may further include cleaning the half-tone layer pattern. The irradiation of the half-tone layer pattern may include loading pattern design data to be irradiated to the photomask in an e-beam irradiation system, loading the photomask in the e-beam irradiation system, and irradiating the e-beams to the photomask based on the pattern design data. A pattern design may include a depiction region and non-depiction regions that are disposed in the depiction region and not formed as e-beam resist patterns. The non-depiction regions may be formed as a rectangular or bar type. The length of a short side of each of the non-depiction regions may be at most 2.4 times the diffusion distance of acid radicals of the e-beam resist. Furthermore, the present inventive concept may be applied to a photolithography process. An optical proximity effect similar to an e-beam proximity effect may be obtained due to optical effects, such as interference, diffraction, or scattering. When a pattern design is embodied as an opaque layer pattern disposed on a photomask and applied to the photolithography process, about the same effects as in the present inventive concept may be expected. This effect may be produced using, e.g., the e-beam profile of FIG. 5B.

The opaque layer pattern disposed on the photomask may include a transparent region and an opaque region. Therefore, when the depiction region and the non-depiction region according to the inventive concept are expanded and an opaque region is disposed in a transparent region, the effects of the present inventive concept may be expected even in a photolithography process. The size of an opaque region may be determined in consideration of a diffusion distance of photo-acids generated by a photo-acid generator in chemically-amplifying-type photoresist. That is, the size of a non-depiction region may be optimized on an e-beam pattern design in consideration of a diffusion distance of photo-acids of photoresist and a diffusion distance of acid radicals of e-beam resist.

Figure 8:
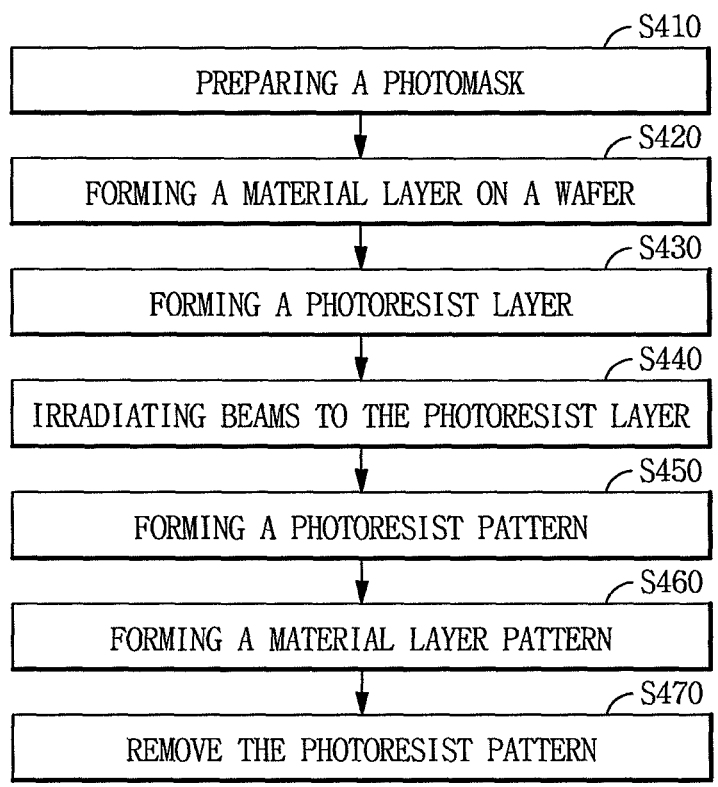
FIG. 8 illustrates a flowchart illustrating a method of fabricating a semiconductor device using a photomask according to example embodiments.

FIG. 8 is a flowchart illustrating a method of fabricating a semiconductor device using a photomask according to example embodiments. In particular, FIG. 8 illustrates a one-time photolithography process involving a series of process operations. Referring to FIG. 8, the method may include preparing a completed photomask (S410), forming a material layer on a wafer (S420), forming a photoresist layer on the material layer (S430), irradiating the photoresist layer with light using the photomask (S440), developing the irradiated photoresist layer to form a photoresist pattern (S450), etching the material layer using the photoresist pattern as an etch mask to form a material layer pattern (S460), and removing the photoresist pattern (S470). The photomask may be fabricated using a pattern design including a depiction region in which e-beams are irradiated and a non-depiction region disposed in the depiction region and in which the e-beams are not irradiated. A method of depicting or fabricating the pattern design or the photomask can be fully understood with reference to the descriptions of the present specification.

Figure 9A:
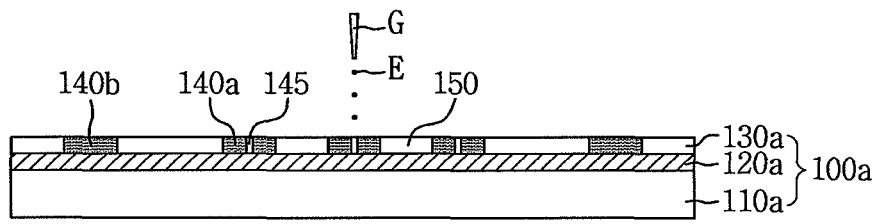
FIGS. 9A through 9D illustrate diagrams illustrating methods of fabricating photomasks according to example embodiments.

FIGS. 9A through 9D are diagrams illustrating methods of fabricating photomasks according to example embodiments. Referring to FIG. 9A, a blank photomask 100a may be prepared, an e-beam resist layer 130a formed on the blank photomask 100a may be divided into e-beam depiction regions 140a and 140b and an e-beam non-depiction region 145, and only the e-beam depiction regions 140a and 140b may be irradiated with e-beams. Space regions 150 may be disposed between the e-beam depiction regions 140a and 140b. The e-beam depiction regions 140a may include the e-beam non-depiction region 145 in the alternating pattern, while the e-beam depiction regions 140b may not include the e-beam non-depiction regions 145 in the isolated pattern. The e-beam depiction regions 140a and 140b may be irradiated with e-beams by irradiating electrons E from an electronic gun G. The blank photomask 100a may refer to a state where no pattern is formed. The blank photomask 100a may include a transparent photomask substrate 110a, an opaque layer 120a disposed on the transparent photomask substrate 110a, and an e-beam resist layer 130a disposed on the opaque layer 120a. The e-beam resist layer 130a may refer to a state where no e-beams are irradiated. A sufficient description of the e-beam depiction regions 140a and 140b and the e-beam non-depiction regions 145 has been provided in the present specification.

Figure 9B:
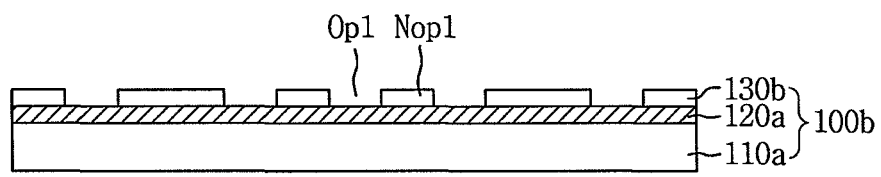
Figure 9C:
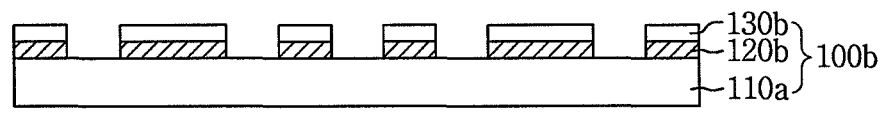
Figure 9D:
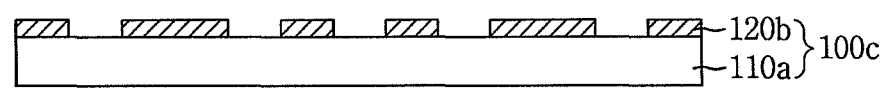

Referring to FIG. 9B, the blank photomask 100b irradiated with e-beams may be developed to form an e-beam resist pattern 130b. The e-beam resist pattern 130b may include an open pattern Op1 and a non-open pattern Nop1, which may selectively expose the opaque layer 120a. The open pattern Op1 may be interpreted as a clear pattern, and the non-open pattern Nop1 may be interpreted as a dark pattern. In this case, the e-beam non-depiction region 145 may not form an independent pattern but be absorbed into a pattern of its adjacent e-beam depiction region 140a. Referring to FIG. 9C, the exposed opaque layer 120a may be removed using the e-beam resist pattern 130b as an etch mask, thereby forming an opaque layer pattern 120b to selectively expose the photomask substrate 110a. Referring to FIG. 9D, the e-beam resist pattern 130b may be removed, thereby completing the formation of a photomask 100c according to the inventive concept.

Figure 10A:
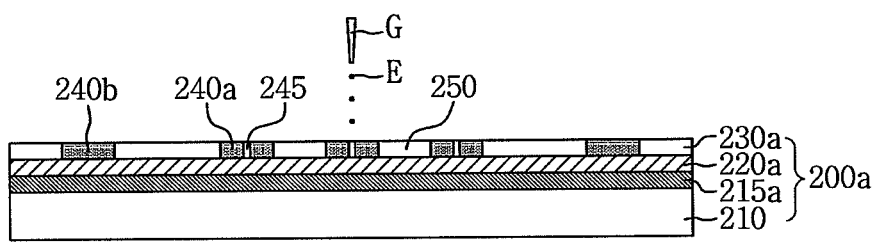
FIGS. 10A through 10F illustrate diagrams illustrating methods of fabricating attenuated phase-shift photomasks according to example embodiments.

FIGS. 10A through 10F are diagrams illustrating methods of fabricating attenuated phase-shift photomasks according to example embodiments. Referring to FIG. 10A, an attenuated phase-shift blank photomask 200a may be prepared. An e-beam resist layer 230a formed on the attenuated phase-shift blank photomask 200a may be divided into e-beam depiction regions 240a and 240b and an e-beam non-depiction region 245, and only the e-beam depiction regions 240a and 240b may be irradiated with e-beams. The attenuated phase-shift blank photomask 200a may include a transparent photomask substrate 210, a half-tone layer 215a disposed on the transparent photomask substrate 210, an opaque layer 220a disposed on the half-tone layer 215a, and the e-beam resist layer 230a disposed on the opaque layer 220a.

Figure 10B:
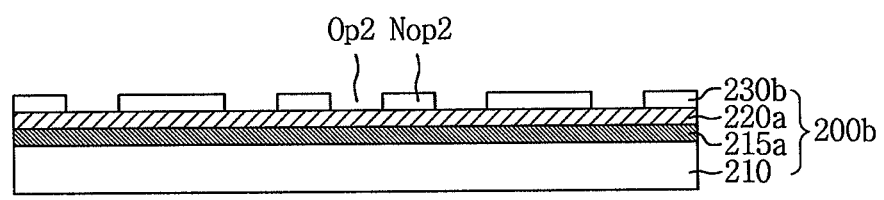
Figure 10C:
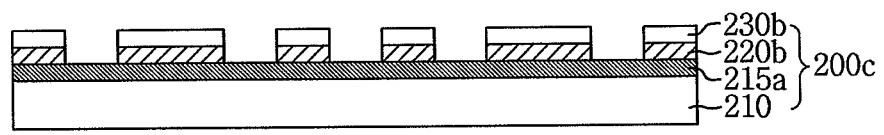
Figure 10D:
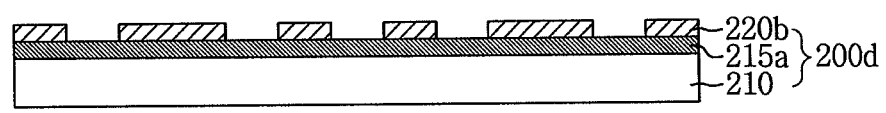
Figure 10E:
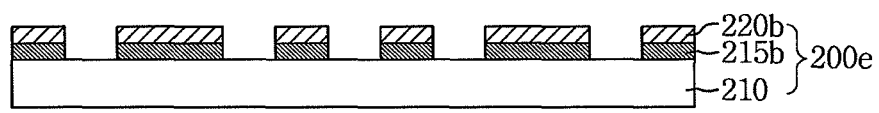
Figure 10F:
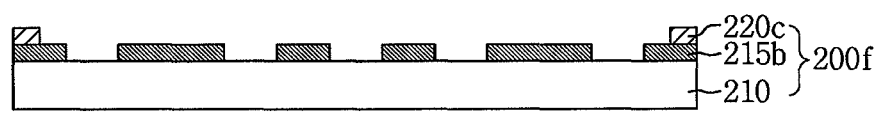

Referring to FIG. 10B, an attenuated phase-shift blank photomask 200b irradiated with e-beams may be developed to form an e-beam resist pattern 230b. The e-beam resist pattern 230b may include an open pattern Op2 selectively exposing the opaque layer 220a and a non-open pattern Nop2. In this case, it can be seen that the e-beam non-depiction region 245 may not form an independent pattern but be absorbed into a pattern formed by its adjacent e-beam depiction region 240a. Referring to FIG. 10C, the exposed opaque layer 220a may be removed using the e-beam resist pattern 230b as an etch mask, thereby forming an opaque layer pattern 220b to selectively expose the half-tone layer 251a. Referring to FIG. 10D, the e-beam resist pattern 230b may be removed. Referring to FIG. 10E, the exposed half-tone layer 215a may be removed using the opaque layer pattern 220b as an etch mask, thereby forming a half-tone layer pattern 215b to selectively expose the photomask substrate 210. Referring to FIG. 10F, an attenuated phase-shift photomask 200f including a selectively removed opaque layer pattern 220c according to the inventive concept may be completed.

Figure 11A:
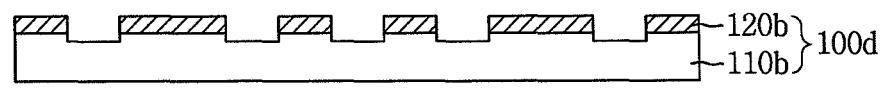
FIGS. 11A and 11B illustrate diagrams illustrating methods of fabricating substrate-etching phase-shift photomasks according to example embodiments.
Figure 11B:
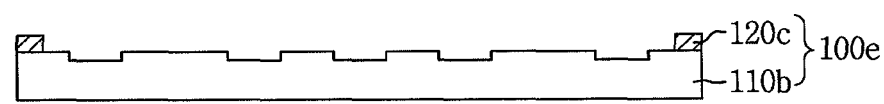

FIGS. 11A and 11B are diagrams illustrating methods of fabricating substrate-etching phase-shift photomasks according to example embodiments. Referring to FIG. 11A, after the process of FIG. 9D is finished, the photomask substrate 110b may be etched to an appropriate depth using the opaque layer pattern 120b as an etch mask. Referring to FIG. 11B, a substrate-etching phase-shift photomask 100d including a selectively removed opaque layer pattern 120c according to the inventive concept may be completed.

In addition, the names and functions of unshown or undescribed components may be easily understood with reference to other drawings of the present specification and descriptions thereof.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of depicting a photomask using electron beams (e-beams), comprising:
    preparing a photomask including an e-beam resist thereon;
    depicting the e-beam resist; and
    forming an e-beam resist pattern, wherein:
    depicting the e-beam resist includes irradiating e-beams to an e-beam depiction region without irradiating the e-beams to an e-beam non-depiction region disposed in enclosed by the e-beam depiction region, and
    forming the e-beam resist pattern includes forming an open region that exposes an underlying layer by removing the e-beam depiction region and by removing substantially an entirety of the e-beam non-depiction region.

2. The method as claimed in claim 1, wherein:
    the e-beam non-depiction region includes one of a rectangular shape, a bar shape, and a combination thereof, and when depicting the e-beam resist, the e-beam non-depiction region is formed between a first portion of the e-beam depiction region and a second portion of the e-beam depiction region,
    the e-beam resist is chemically-amplifying-type e-beam resist obtained by generating acid radicals due to irradiation of the e-beams and diffusing the acid radicals a plurality of predetermined distances, and
    a short length of the e-beam non-depiction region is about 2.4 or less times as long as at least one diffusion distance of the plurality of diffusion distances of the acid radicals of the e-beam resist.

3. The method as claimed in claim 1, wherein:
    the e-beam depiction region is an alternating pattern including lines and spaces alternately arranged, and
    a width of each space is at least twice a short length of the e-beam non-depiction region to at most twice a short length of the e-beam depiction region disposed in the same direction as the width of each space.

4. The method as claimed in claim 3, further comprising forming an isolated pattern,
    wherein a second e-beam depiction region formed in the isolated pattern is substantially free from other e-beam depiction regions within the range of a distance of at most twice a short width thereof,
    the second e-beam depiction region in the isolated pattern excludes any e-beam non-depiction regions enclosed therein,
    the second e-beam depiction region in the isolated pattern is depicted as a unit beam shot region, and
    the second e-beam depiction region in the alternating pattern is depicted as a sub-unit beam shot region smaller than the unit-beam shot region.

5. A method of fabricating a photomask, comprising:
    preparing a photomask substrate;
    forming an opaque layer on the photomask substrate;
    forming an electron beam (e-beam) resist on the opaque layer;
    depicting the e-beam resist using e-beams; and
    forming an e-beam resist pattern,
    wherein depicting the e-beam resist using the e-beams includes depicting an e-beam depiction region using the e-beams without depicting an e-beam non-depiction region using the e-beams, the e-beam non-depiction region being disposed in enclosed by the e-beam depiction region, and
    the e-beam resist depicted using the e-beams includes an open region in the e-beam resist pattern that exposes the opaque layer, and a non-open region covering the opaque layer, the open region being formed by removing the e-beam depiction region and by removing substantially an entirety of the e-beam non-depiction region.

6. The method as claimed in claim 5, wherein:
    the e-beam non-depiction region includes one of a rectangular shape, a bar shape, and a combination thereof, and when depicting the e-beam resist, the e-beam non-depiction region is formed between a first portion of the e-beam depiction region and a second portion of the e-beam depiction region,
    the e-beam resist is chemically-amplifying-type e-beam resist obtained by generating acid radicals due to irradiation of the e-beams and diffusing the acid radicals a plurality of predetermined distances,
    a short length of the e-beam non-depiction region is about 2.4 or less times as long as at least one diffusion distance of the plurality of diffusion distances of the acid radicals of the e-beam resist, and
    a region of the e-beam resist of the photomask corresponding to the e-beam non-depiction region is patterned by diffusing the acid radicals.

7. The method as claimed in claim 6, wherein the diffusion distance of the acid radicals is about 30 nm or less.

8. The method as claimed in claim 5, wherein:
    the e-beam depiction region is an alternating pattern including lines and spaces alternately arranged, and
    a width of each space is at least twice as long as a short length of the e-beam non-depiction region to at most twice as long as a short length of the e-beam depiction region disposed in the same direction as the width of each space.

9. The method as claimed in claim 8, further comprising forming an isolated pattern,
    wherein a second e-beam depiction region formed in the isolated pattern is substantially free from other e-beam depiction regions within the range of a distance of at most twice a short width thereof, the second e-beam depiction region in the isolated pattern excludes any e-beam non-depiction regions enclosed therein, the second e-beam depiction region in the isolated pattern is depicted as a unit beam shot region, and the e-beam depiction region in the alternating pattern is depicted as a sub-unit beam shot region smaller than the unit-beam shot region.

10. The method as claimed in claim 1, wherein:

depicting the e-beam resist includes forming a space region adjacent to a first portion of the e-beam depiction region and to a second portion of the e-beam depiction region, the first and second portions being on opposite sides of the e-beam depiction region, and the space region being spaced apart from the e-beam non-depiction region, and forming the e-beam resist pattern includes forming a non-open region that corresponds to the space region in the e-beam resist and that is adjacent to the open region in the e-beam resist pattern.

11. The method as claimed in claim 10, wherein the first and second portions of the e-beam depiction region have substantially the entirety of the non-depiction region directly therebetween such that the open region is formed as a continuous region.

12. The method as claimed in claim 5, wherein:

depicting the e-beam resist includes forming a space region adjacent to a first portion of the e-beam depiction region and to a second portion of the e-beam depiction region, the first and second portions being on opposite sides of the e-beam depiction region, and the space region being spaced apart from the e-beam non-depiction region, and forming the e-beam resist pattern includes forming the non-open region so as to correspond to the space region in the e-beam resist and so as to be adjacent to the open region in the e-beam resist pattern.

13. The method as claimed in claim 12, wherein the first and second portions of the e-beam depiction region have substantially the entirety of the non-depiction region directly therebetween such that the open region is formed as a continuous region.

14. A method of fabricating a semiconductor device using a method of depicting a photomask using electron beams (e-beams), comprising:

preparing the photomask;

forming a material layer on a wafer;

forming a photoresist on the material layer;

irradiating the photoresist with light using the photomask;

developing the irradiated photoresist to form a photoresist pattern;

etching the material layer using the photoresist pattern as an etch mask to form a material layer pattern; and removing the photoresist pattern, wherein:

the photomask includes a depiction region in which e-beams that are configured to depict an e-beam resist pattern are irradiated, and a non-depiction region disposed-in enclosed by the depiction region and in which the e-beams that are configured to depict the e-beam resist pattern are not irradiated, and forming the photoresist pattern includes forming an open region through which the material layer is etched by removing the depiction region and by removing substantially an entirety of the non-depiction region.

* * * * *